(12) United States Patent
Kadri

(10) Patent No.: US 10,771,081 B2
(45) Date of Patent: Sep. 8, 2020

(54) MULTI-CORE CIRCUIT WITH MIXED SIGNALING

(71) Applicant: Hewlett Packard Enterprise Development LP, Houston, TX (US)

(72) Inventor: Rachid Kadri, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 142 days.

(21) Appl. No.: 16/066,800

(22) PCT Filed: Jan. 15, 2016

(86) PCT No.: PCT/US2016/013534
§ 371 (c)(1),
(2) Date: Jun. 28, 2018

(87) PCT Pub. No.: WO2017/123238
PCT Pub. Date: Jul. 20, 2017

(65) Prior Publication Data
US 2019/0028112 A1 Jan. 24, 2019

(51) Int. Cl.
*H03M 1/12* (2006.01)
*G06F 1/04* (2006.01)
(Continued)

(52) U.S. Cl.
CPC .............. *H03M 1/124* (2013.01); *G06F 1/04* (2013.01); *G06F 12/0831* (2013.01);
(Continued)

(58) Field of Classification Search
CPC ........ H03M 1/12; H03M 1/123; H03M 1/124; G06F 1/04
See application file for complete search history.

(56) References Cited

U.S. PATENT DOCUMENTS 6,938,177 B1 8/2005 Blemel
7,006,521 B2 2/2006 Nguyen
(Continued)

FOREIGN PATENT DOCUMENTS

CN 202977897 U 6/2013
EP 2336920 6/2011
(Continued)

OTHER PUBLICATIONS

Markets and Markets, Global Mixed Signal System-on-Chip (MxSoC) Market (2011-2016), web page, www.marketsandmarkets.com, Dec. 2011, 4 pages.
(Continued)

*Primary Examiner* — Glenn A. Auve
(74) *Attorney, Agent, or Firm* — Park, Vaughan, Fleming & Dowler LLP

(57) ABSTRACT

In one example, a mixed signaling socket includes a set of central processing unit (CPU) cores coupled via an inter-core link and a set of analog circuits having an analog input, each analog circuit coupled to a respective CPU core via a separate private bus. A field programmable gate array (FPGA) control circuit is coupled to the inter-core link and the set of analog circuits to provide predicable clock timing to the set of analog circuits and control signals to the set of CPU cores. An analog to digital module in at least one CPU core includes instructions to perform an analog to digital conversion to create a digital representation of the analog input using the predictable clock timing and control signals from the FPGA.

15 Claims, 5 Drawing Sheets

(51) Int. Cl.
 G06F 12/0831 (2016.01)
 G06F 13/16 (2006.01)
 H03M 1/46 (2006.01)
(52) U.S. Cl.
 CPC ........ G06F 13/1689 (2013.01); H03M 1/123 (2013.01); H03M 1/46 (2013.01)

(56) References Cited

U.S. PATENT DOCUMENTS

2013/0262073 A1\* 10/2013 Asaad ................. G06F 17/5027
   703/14
2013/0262911 A1   10/2013 Boerger
2014/0115266 A1    4/2014 Daniel
2018/0269887 A1\*  9/2018 Nixon ....................... G06J 1/00

FOREIGN PATENT DOCUMENTS

JP   2011150637     8/2011
KR    100170709     3/1999

OTHER PUBLICATIONS

Julius Von Rosen, "A Highly Dependable, Analog Multi-Core Mixed-Signal Task Distribution System", Jun. 9, 2015, 211 pages, <http://d-nb.info/1079361987/34>.
PCT International Search Report and Written Opinion, dated Oct. 6, 2016, for Application No. PCl/US2016/013534, 13 pages.

\* cited by examiner

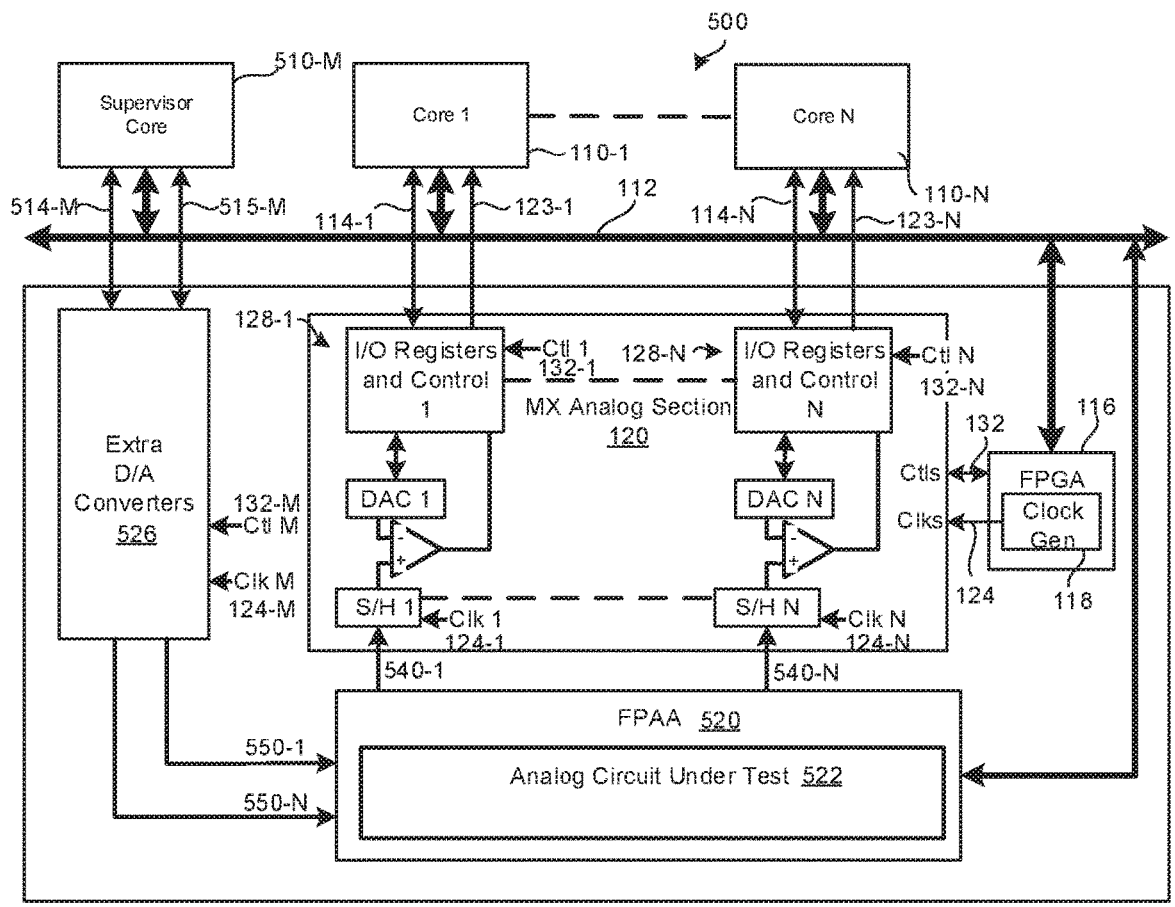
Fig. 5
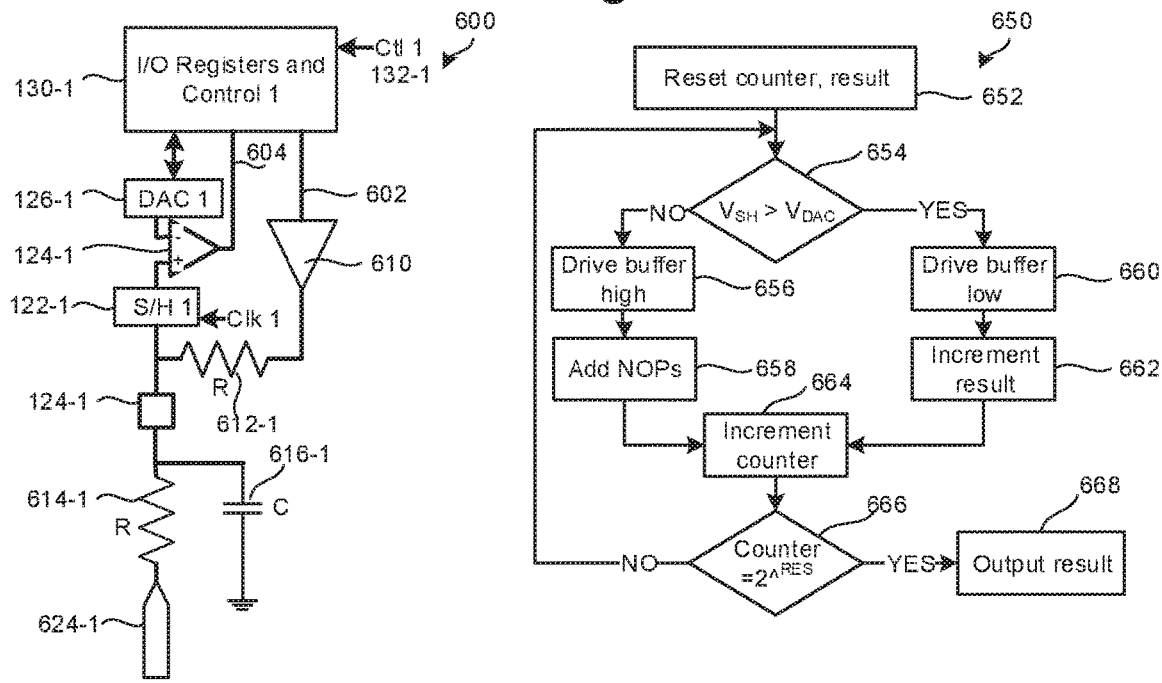
Fig. 6A                    Fig. 6B

MULTI-CORE CIRCUIT WITH MIXED SIGNALING

BACKGROUND

High accuracy and high performance analog to digital converters have been limited to specialized technical and scientific fields due to cost and the need for constant calibration. However, as analog sensors have been integrated into consumer devices such as smartphones, watches, personal computers (PCs) and now various household devices with the "Internet of Things", it has been difficult to achieve high accuracy while keeping costs low. As the scope of products included in the "Internet of Things" expands, technology solutions incorporating analog circuits are expected to use less power and space while offering more reliability and performance.

BRIEF DESCRIPTION OF THE DRAWINGS

The disclosure is better understood with reference to the following drawings. The elements of the drawings are not necessarily to scale relative to each other. Rather, emphasis has instead been placed upon clearly illustrating the claimed subject matter. Furthermore, like reference numerals designate corresponding similar parts through the several views.

FIG. 5 is an example MX socket lab-on-a-chip device that includes a field programmable analog array (FPAA) and extra set of D/A converters;

FIG. 6A is an example sigma-delta A/D converter;

FIG. 6B is an example flowchart of an analog to digital conversion process used with the circuit of FIG. 6A;

DETAILED DESCRIPTION

Much of the processing done in communications, photography, networking, biometrics, and the like are based on real world analog signals while most applications of those real world analog signals are performed by digital computation. Much of the translation between the analog and digital world today takes place using analog to digital converters (ADCs or alternatively A/D converters). However, whether implemented as stand-alone components or within DSPs, these ADCs add additional cost and complexity in implementing various system-on-a-chip or other MX systems. This complexity is because the programming of DSPs is generally done with proprietary instruction sets and/or languages that have small math libraries and limited DSP functional capabilities as compared to enterprise class processors found in servers and workstations. As more and more mixed signal (MX) applications demand higher computing power to process analog signals, conventional DSPs will be unable fill the demand due to their limited sampling capabilities and digital processing limitations.

A new mixed signaling (MX) architecture for a MX socket device is disclosed herein that allows for faster sampling of analog signals and the use of increased computing power on digitized versions of the sampled analog signals. Such signal processing computational performance is unmatched by conventional digital signal processing (DSP) based MX systems. This new MX architecture combines both the general purpose and enhanced vector processing instructions sets of enterprise class central processing units (CPU) with configurable analog circuitry to allow for an overall reduction in system complexity while at the same time allowing for increased performance, expanded capabilities, and fast development cycles because of the integration of these functions in a single component.

Figure 1:
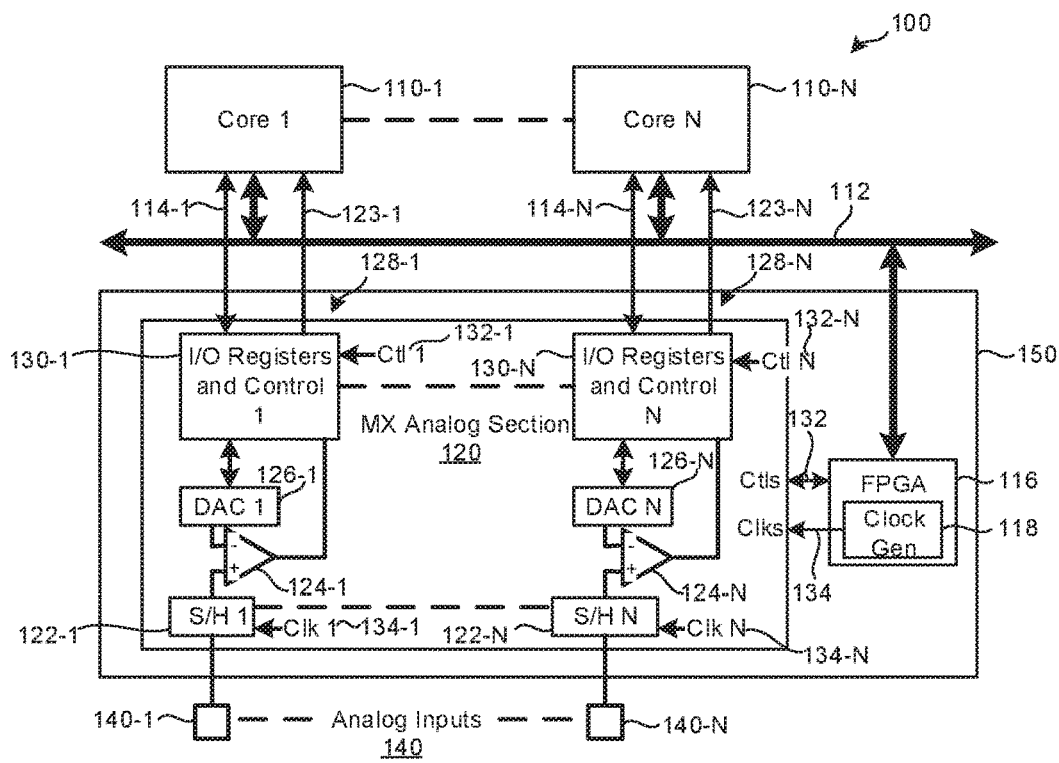
FIG. 1 is an example MX socket device with a set of enterprise class cores coupled to a mixed signaling block that includes a mixed signaling (MX) analog section and a field programmable array (FPGA)

FIG. 1 is an example MX socket device 100 with a set of N (two or more) enterprise class cores 110-1, 110-N coupled to a mixed signaling block 150 that includes a MX analog section 120 with several mixed analog circuits 128-1, 128-N and a field programmable array (FPGA) 116 to allow for the custom generation of control signals 132 and clocks 134 such as with a programmable clock generator 118. In some examples, the FPGA 116 may be replaced with dedicated digital logic and state machines, however, flexibility is increased with being able to programmably configure the control signals and clock timing. The FPGA may be configured to program control signals 132 using I/O registers, state machines, and/or logic circuits. The clock generator 118 may include one or more oscillators or inputs derived from the various CPU clocks and have dividers, multipliers, and logic to create a set of coordinated clocks 134.

This new MX architecture also allows for a system-on-a-chip or lab-on-a-chip concept with enterprise class CPU's rather than less capable micro-controllers, digital signal processors, or proprietary CPUs. This new MX architecture allows for the implementation of a versatile programmable/configurable analog to digital processing system. The advantage of using enterprise class CPU's is that there is an enormous wealth of math libraries and special signal processing applications already available to process the analog information once it is digitized. Rather than having a separate analog to digital conversion IC, major portions of the analog to digital conversion may be performed on one or more enterprise class multi-core die by adding a few analog circuits that could be configured from a library of S/H circuits, comparators, resistor ladders, registers to configure one or more A/D converters as needed to be interfaced to each core to allow the A/D conversion to be implemented by the enterprise core. Because the enterprise multi-cores are designed to operate at high frequencies and share data over a high speed inter-core link, the new architecture can sample the analog data at much higher sampling rates than done traditionally with conventional A/D components.

While one of skill in the art would typically not want to use an enterprise class CPU to do the A/D conversion due to its large die size and power consumption as well as unpredictable bus timing and latency, this new MX architecture allows enterprise class cores to perform an A/D function as just part of their overall general purpose programming.

Consequently, the overall system silicon real-estate and power consumption may be reduced.

In order to achieve this capability, the new enterprise cores disclosed herein have a new handshaking control interface and separate data interface paths to the respective associated analog circuits to allow for not having to wait for unpredictable inter-core link arbitration times and to allow for the monitoring of when an A/D conversion is complete. Due to the new handshaking control interface, various types of A/D converters may be implemented with this architecture depending on the application requirements and such A/D converters include successive approximation register (SAR), sigma-delta converters (ΣΔ) (also known as delta-sigma (ΔΣ) converters), and flash ADCs, as just some examples. In addition, more than one enterprise core can be used in implementing a particular ADC thus allowing for higher sampling rates, improved accuracy, and faster conversions. Accordingly, the overall system cost and complexity may be reduced compared to conventional approaches which tend to separate the analog and digital functions to allow each to be optimized. With this new MX architecture, the enterprise class cores may be reassigned to do other conventional computing functions when not doing the analog conversions or digital signal processing thus allowing for improved overall system efficiency.

Each of the enterprise cores 110-1, 110-N is coupled to each other and the FPGA 116 via a high speed inter-core link 112. In some examples, the FPGA 116 may be coupled to the enterprise cores 110-1, 110-N via a peripheral bus, such as PCI 3.0, PCI 2.0, PCIx, and the like. To extend the enterprise multi-core socket applications into the analog signal processing world, the mixed signaling analog section 120 is implemented to allow for receiving analog input signals at analog inputs 140 (140-1, 140-N) for conditioning prior to processing.

This solution allows the processing of analog signals to be implemented in a set of two acts:
1) Sampling an analog signal with a hardware implementation of mixed analog circuits 128-1, 128-N of sample and hold (S/H) circuits 122-1, 122-N and digital to analog (D/A) converters 126-1, 126-N implemented in MX analog section 120 along with a set of comparators 124-1, 124-N to allow for the comparison of the DAC 126-1, 126-N outputs and respective S/H circuits 122-1, 122-N; and
2) Converting the sampled analog signal in an ADC process performed by one or more of the enterprise class cores 110-1, 110-N

While other CPU cores may be used, maximum performance is achieved with enterprise class CPUs 110 that have at least 64 bit wide data paths, integer size, and memory address widths. Further there are two or more multiple independent homogenous computational cores on a single die that can execute program instructions. For instance, one brand of x86 based microprocessors that are enterprise class is the XEON™ family designed and manufactured by Interim Corporation. These processors are generally marketed to non-consumer workstation, server, and embedded system markets, although they have software compatibility with consumer PCs. These processors also have multi-socket capabilities, higher core counts, and generally support ECC memory to protect against memory errors thereby allowing for increased reliability and speed. Other enterprise class CPUs include AMD™'s OPTERON™ microprocessors, IBM™'s XENON™ to name just a couple examples. These enterprise class CPUs generally have a multi-GHz internal operating core frequencies with turbo-boost capability and as well a multi-GHz external bus frequency such as Intel™'s QuickPath point to point interconnect that may operate to over 6 GigaTransactions/sec. r AMD™'s has a similar HyperTransport™ inter-processor bus.

Additionally, with advanced vector extensions, enterprise class CPUs allow use of single instruction multiple data (SIMD) instructions sets that increase the available data size from 64 bits to 128, 256, or even 512 bits. Such SIMD instructions allow for increased parallelism and throughput in floating point and digital signal processing applications.

Each of any enterprise class cores 110-1, 110-N that are used with the MX analog section 120 interfaces to its respective analog circuits via an Input/Output (I/O) set of registers and control signals 130-1, 130-N via a private bus 114-1, 114-N and handshake signals 132-1, 132-N. The private bus may be of any width but 8 bits, 12 bits, and 16 bits are some examples. The I/O set of registers and control signals 132-1, 132-N allow the respective enterprise class core 110-1, 110-N to directly bypass the inter-core link 112 and thus avoid bus arbitration delays when communicating with the respective DAC 126-1, 126-N and receiving the results of the A/D conversion and when it is complete. For example, one of the A/D conversion options that may be performed by the cores is a successive approximation A/D conversion technique. However, there are other options to implement the A/D conversion including sigma-delta converters, flash converters, interleaved converters, etc. as the handshaking interface between a core and its respective MX analog circuit allows the core to exercise crucial tight time control to minimize sampling frequency noise.

A/D conversion timing may also be controlled by the FPGA 116 which may be programmed to implement various clocks 134 with no or very low jitter for sampling and any control signals 132, such as end-of-conversion (EOC) timing signals 132-1, 132-N. The EOC timing signals 132-1, 132-N are used for signaling a core when to start a new conversion. Sample time errors due to jitter caused by CPU core and bus clocks may accordingly be avoided as the FPGA 116 and its clock generator 118 may be programmed to provide precise timing for when to sample analog signals and perform the analog to digital conversion without having to wait for an unpredictable latency on the inter-core link 112 due to arbitration delays.

Depending on the application, if more than one core and A/D are assigned to the conversion process, a supervising core (310, FIG. 3) overseeing the conversion task may be used to send all the required information to every core involved, prior to the start of the conversion process. The FPGA 116 may control the EOC signal 132-1, 132-N to each core and the S/H sampling clock 134-1, 134-N until the entire conversion process is terminated by the supervising core. The supervision core 310 may be one of the cores involved in the A/D conversion process or it may be a separate core depending on the application. The sampling rate that may be handled by a particular core depends on the operating clock frequency of the core and the inter-core link 112.

Figure 2:
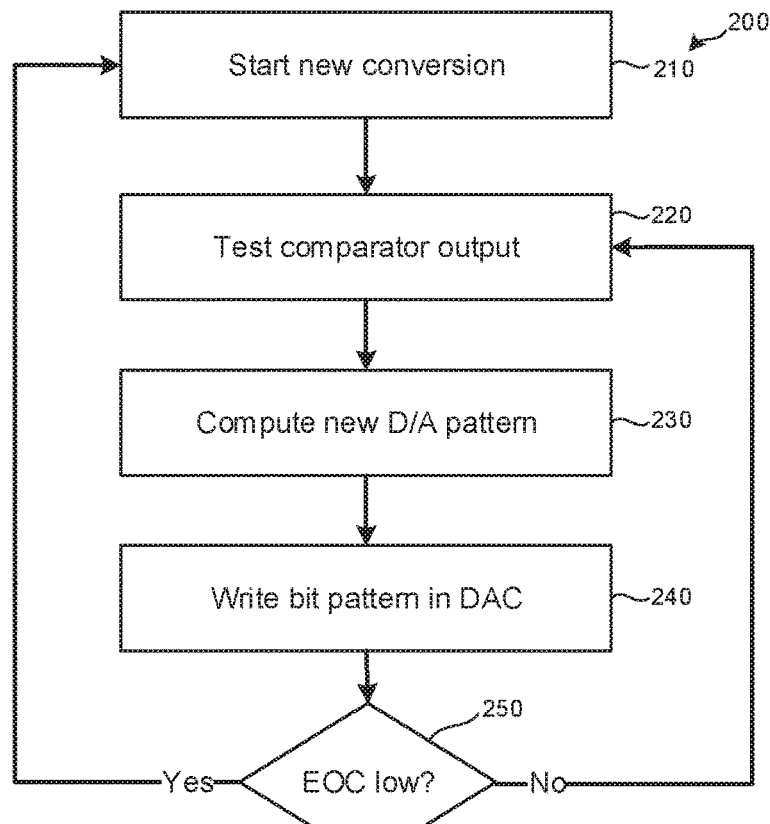
FIG. 2 is an example flow chart of a successive approximation register A/D conversion process.

For instance, FIG. 2 is an example flow chart of a successive approximation A/D conversion process 200. By using a private direct bus 114 (for example an 8 bit private bus) between a core 110 and its respective analog circuit I/O registers and control 130 to provide a direct interface to the A/D circuits, much higher frequencies for sampling may be performed by being able to bypass the latency with bus arbitration when using an inter-core link 112. Even when the inter-core link 112 is operating at much higher frequencies than the core frequencies, there may still be a significant delay (such as 10 ns) which may also be unpredictable depending on other higher priority tasks within the computing system. Further, since the FPGA 116 is typically configured during set up and prior to any conversion, it may be connected to the inter-core link 112, although in other examples it may also have a separate direct bus 114 or be connected via one of several standard peripheral busses.

Assume that a core is operating at 2 GHz (Tclock-0.5 ns) and using the private bus interface method and the A/D conversion process 200, such as a SAR algorithm, contains 5 instructions. Using an 8 bit resolution, then the time spent to do one conversion after the start of a new conversion in block 202 is:

1) Test comparator 124 output in block 204: 1 clock
2) Compute new D/A pattern in block 206: 1 clock
3) Write a bit pattern in DAC 126 in block 208: 1 clock
4) In decision block 210, if EOC 132 low, start new conversion in block 202 (1 clock), else the comparator is tested again in block 204 to continue the conversion: 1 clock.

Accordingly, for an 8-bit resolution of the A/D conversion, the core executes eight iterations of the steps 1-4 above:

$$8\times(5 \text{ instructions}*0.5 \text{ ns/instruction})=20 \text{ ns or } 50 \text{ Mhz per core}$$

By contrast, when compared to using the inter-core link 112 instead, would add approximately 10 ns (for example) to each instruction when handshaking with the analog section. This amounts to a 10 MHZ overall sampling rate. The 10 MHz or 50 MHz sampling rates may be well above the requirement for typical audio processing in the music industry or EEG (electroencephalogram brain monitor) or ECG (electrocardiogram heart monitor, also referred to as an EKG) signals used in the health care industry and thus the enterprise class core 110 may be used for other functions such as the further signal processing of the digital signal. However, there may be some old and new applications in communications, visual reality, 3D motion detection, and others that require even higher sampling frequencies than 50 MHz. In these situations, depending on the desired sampling frequency, the core clock frequency may be boosted during the A/D conversion process or in other examples, more than one enterprise class core may be used in an interleave mode to further increase the conversion frequency rate.

Figure 3:
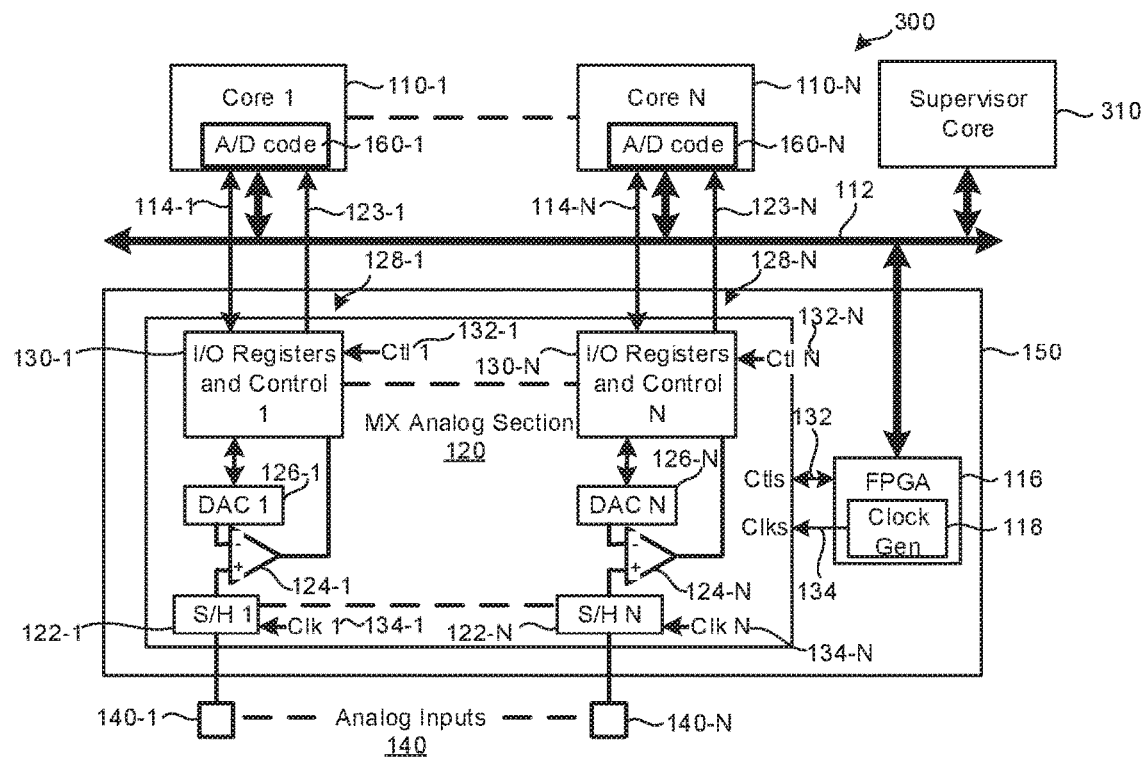
FIG. 3 is an example interleaved MX socket device with a set of enterprise class cores coupled to an MX analog section that includes a supervisor core.

FIG. 3 is an example interleaved MX socket device 300 with a set of N (two or more) enterprise class cores 110-1, 110-N coupled to a mixed signaling (MX) analog section 120 which includes a supervisor core 310. The supervising core 310 may be one of the enterprise class cores 110-1, 110-N or a separate enterprise class core 310 that is not coupled to MX analog circuitry 128. To implement the interleave mode, the supervisor core 310 is used to configure the on package FPGA 116 to initialize and set up the MX analog circuits 128-1, 128-N with the appropriate sampling frequency, sampling interval, resolution, and accuracy.

Interleaving A/D converters typically may create several different error sources due to differences in the various voltage offsets, non-linearities, and signal gains of the analog circuitry. By having the enhanced processing capabilities of the enterprise class cores available, there errors can be calibrated out or corrected during the A/D process to keep accuracy and resolution high. For instance, in one example, during a calibration process, each of the analog inputs 140-1, 140-N can be connected together and supplied a common signal. Each of the MX cores can perform a set of A/D set of conversions over the full input range of the A/D circuitry to detect differences in the various offsets, gains, and non-linearities. The characterized values may be stored in non-volatile memory and used during post digital signal processing to correct the errors and best match the various A/D converters.

Figure 4:
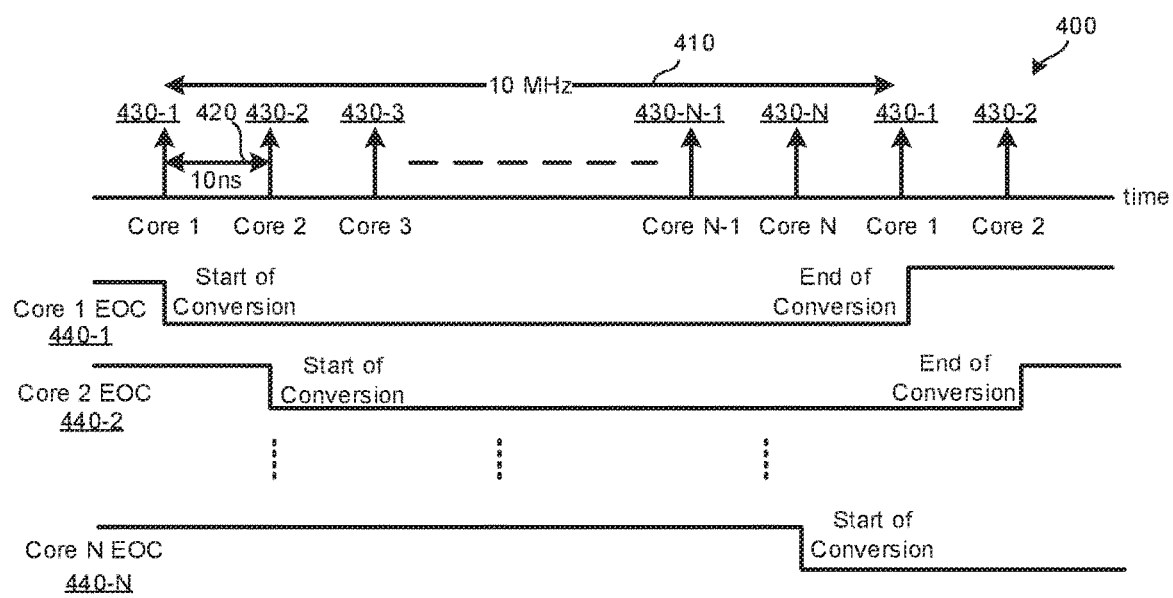
FIG. 4 is an example timing diagram for interleaved mode to illustrate the sequence of various core samplings of the respective S/H circuits in FIG. 3.

FIG. 4 is an example timing diagram for interleaved mode to illustrate the sequence of various core sampling rate of 10 MHz as noted above of the respective S/H circuits 122-1, 122-N in FIG. 3. The supervisor core 310 sets up the FPGA 116 to create new sampling clocks 134-1, 134-N such as samples 430-1, 430-2, 430-3, 430-N-1, 430-N at sampling intervals 420 of say 10 ns within a defined sampling interval 410 of 10 Mhz or 100 ns to sequence through all the S/H circuits 122-1, 122-N. This creates a set of samples that is N times the sampling rate of one core where N=the number of cores involved in the conversion process. The timing of the FPGA 116 thus interleaves each respective S/H circuit 122-1, 122-N and its respective core 110 in real time, so that each core is fed the appropriate data when its sampling time comes up. The supervisor core 310 also sets up the various N cores in the sampling process with the appropriate code to execute when its sampling time comes up using end of conversion (EOC) signals 440-1, 440-2, 440-N. For example, if ten cores 110 are assigned to do the conversion process, then the overall sampling frequency is 10 times what each core 110 could sample, but each S/H circuit 122-1, 122-N will still sample at a 10 MHz rate as explained above and shown in FIG. 4. Once the end of conversion process is complete, the cores can be reassigned to other processing functions or continue to take additional samples.

When each core completes every N-bit conversion, a supervisory core 310 assembles the data from the multiple cores used in the A/D conversion and may send it to any available cores for additional processing. The supervisory core 310 has the task to gather and assemble data especially in the interleave mode. Since cores may complete an N-bit conversion faster than others, the assembled data is tagged and stored in memory and the cores do not start their next conversion until their respective EOC 440-1, 440-2, 440-N is toggled by the FPGA 116 to synchronize and keep data in the correct order for other tasks. Such tasks could be as simple as transferring the digitized signal to be viewed as a waveform on a video screen. In other examples, the digitized signal could be transferred to other cores to do further processing before displaying the results, such as fast Fourier transform (FFT) processing, filtering, decimation, interpolation, domain conversion and the like. Such capabilities of allocating resources to do specific tasks at the required speed in the same component is what the MX socket is excellent at.

Referring back to FIG. 3, each core 110-1, 110-N has its own associated or respective S/H circuit 122-1, 122-N and is monitoring its respective EOC signal 132-1, 132-N. Using the inter-core link 112 for handshake The overall maximum sampling rate reached by using the interleaved mode in this example would be:

$$10\times 10 \text{ MHz}=100 \text{ MHz}$$

This new interleaved architecture is set up as a truly distributed processing system to handle all the A/D functions in parallel, thus taking advantage of the available compute resources and internal high speed buses used with enterprise class core CPUs. It can also be combined with increasing the core clock frequency. For instance, if the core clock is boosted during the A/D conversion such as for example to 3 GHz (Tclock=0.33 ns) and using the private bus interface 114 method then the conversion time is:

$$\left(5 \text{ instructions} * 0.33 \frac{\text{ns}}{\text{instruction}}\right) * 8 = 13.2 \text{ ns or } 75 \text{ MHz} \frac{\text{sampling rate}}{\text{core}}$$

In the interleaved mode, again using 10 cores to do the conversion, the sampling frequency may be up to 750 MHz.

This flexible capability illustrates that when using the MX analog section 120 with the multiple enterprise class cores 110, a user may implement any number of ADCs that have a direct connection from the core 110 to the mixed analog circuit 128 and choose the appropriate resolution, accuracy, and sampling frequency. This type of flexibility cannot be done with conventional off the shelf fast A/D converters. The successive approximation register approach described in FIG. 2 is but one illustration of the flexibility of the MX socket can provide as a combination of hardware and software handshake with the private bus interconnection. If desired a higher resolution greater than 8 bits may be chosen depending on the application and the MX socket 100 still has the flexibility to meet the requirements by allocating the right core count and interleave sampling frequency for the conversion process. Besides the SAR A/D method, a user also has the capability of choosing another implementation of A/D conversion such as sigma-delta and flash converters.

Another use for a custom MX socket is to implement discrete analog functions or—an integrated circuit (IC) where the cost of prototyping silicon is not feasible. In this example, the MX socket offers a user new possibilities of simulating the mixed signal circuit, build it as a prototype, and test it.

FIG. 5 is an example MX socket device 500 that includes a field programmable analog array (FPAA) 520 and extra set of D/A converters 526. Such a MX socket device 500 allows for real-time processing of data by choosing the right sampling frequency and core count due to the internal architecture that allows for distributed processing. An analog circuit under test (ACUT) 522 configured in the FPAA 520 may be stimulated by the extra A/D signals 550-1, 550-N under the control of a supervisor enterprise core M, 510-M with its own private bus 514M and various control signals 515-M. The ACUT's output signals 540-1, 540-N are the inputs to the analog section to allow for the ACUT's monitoring of functionality. The FPGA 116 may be programmed to include additional clock 124-M and control 132-M signals to allow the extra D/A converters 526 to operate synchronously with the ACUT 522 and the mixed analog circuitry 128-1, 128-N and enterprise cores 110-1, 110-N. Accordingly, simulation, emulation, and testing can be done in a single component. Some cores may be dedicated to provide stimulus and others to collect the results from the ACUT for analysis. Further, the DACs, ADCs, and S/H blocks may be used in conjunction with flash memory to perform discrete functions and circuits such as pseudo-analog memory for implementing state machines with multi-level signaling.

FIG. 6A is but one example implementation of a sigma-delta A/D converter 600 using the basic analog configuration shown in analog circuitry sections 128-1, 128-N of FIG. 1. Here the addition of an output signal 602 from I/O registers and control 130-1 is fed to a buffer 610 to provide a high or low signal to the analog input 124-1 through a first resistor 612-1. The external analog signal 624-1 is provided to the analog input 124-1 also through a second resistor 614-1. A capacitor 616-1 is coupled to the analog input 124-1 and ground. The first resistor 612-1 and the capacitor 616-1 provide an integrator function on the output 602 from the I/O register and control 130-1. The DAC 1 126-1 is programmed by a core using the I/O register and control 130-1 to set a $V_{DAC}$ signal at the negative terminal of comparator 124-1. The S/H circuit 122-1 is used to take a sample for each clock signal Clk 1 of the combined external analog signal 624-1 and the buffer 610 output and creates as signal $V_{SH}$ at the positive terminal of comparator 124-1. The comparator output 604 is readable by the core from I/O register and control 130-1.

FIG. 6B is an example flowchart of an analog to digital conversion process 650 used with the circuit of FIG. 6A. In block 652 a counter register and a result register in the respective core 110-1 is reset to all zeros. In decision block 654 the comparator output 604 is checked. If $V_{SH}$ is greater than $V_{DAC}$ then the buffer 610 is driven low to lower the input voltage on the analog input 124-1 and the result register in the core is incremented in block 662. If the comparator output 604 is other, then in block 656, the buffer 610 is driven high to increase the input voltage on the analog input. Depending on the core software implementation, there may need to be an inclusion of no operation (NOPs) steps added to equalize the number of clock cycles in each branch from decision block 654. After each branch completes, the counter register in the core is incremented in block 664. In decision block 666, the counter is checked to see if it has reached the number of cycles related to the desired resolution. In most situations, it will be a factor of two to the power of the number of bits of resolution, $2^{[<]BEGINITALmRES}$. For 10 bits of resolution, the counter limit is $2^{\wedge}10$ or 1024 cycles. If the counter limit has not been reached then the process proceeds back to block 654. If the counter limit has been reached then the result register holds the digital conversion value. This digital conversion value may then be further processed as desired.

The MX socket devices 100, 300, 500 allow for high speed data acquisition systems capable of acquiring many different signals, each one assigned to one or more cores for sampling, converting, and processing. One or more supervising cores may be operating at frequencies much higher than other cores in order to handle complex multi-tasks. The MX socket devices 100, 300, 500 are ideal for students, engineers, and scientists by allowing them to avoid having to use an off-the shelf very high speed ICs to simulate, build, and test as such devices are generally not available to everyone in the engineering community due to their high cost and the time needed to construct and operate the prototype.

For instance, MX socket devices 100, 300, 500 allow the resolution to be selectable through code. For instance with a SAR ADC, the number of iterations, which correspond to the number of bits of resolution, are programmable as described with FIG. 2. The accuracy of a MX socket device 100, 300, 500 is selectable through the analog selection of components. For instance, the particular architecture of the analog selection often times determines the accuracy. One example is the type and values of a resistor ladder or switch capacitive array for the A/D converter which can be selected for that purpose. The speed of conversion is determined from the configuration and selection of any number of S/H circuits from the analog section paired with their respective cores. For instance, in interleaving mode this is how high frequency sampling rates are achieved. The conversion process is programmed in a core that may operate at many multiples of MHz. Depending on a users particular application, the sampling frequency can be varied and is under the control of the FPGA, which is programmed by a supervising core 310, 510-M.

Some of the various differences over conventional solutions is in terms of components. For instance, the described MX socket devices 100, 300, 500 have enterprise class CPU cores 110 with direct connection via a private bus 114 and EOC handshaking control 123 to the respective analog section 128. When combined with a FPAA 520, there is the ability to have a strong emphasis on "analog processing" due to the capability to program functional circuits using analog blocks. The analog section 120 may include a number of analog components such as op amps, comparators, transistors, current sources, sample and hold circuits, capacitor and resistor arrays, transmission gates, etc. which may be configured into a number of functional blocks to configure circuit(s) according to user needs. Using the available op-amps, the analog section may be optimized to configure more complex circuits such as filters, mixers, amplifiers, analog state-machines and the like. Circuits can be tested on-chip under core control and core input stimulus by building extra D/A converters in the analog section 120 for input stimulus and reading the output signals of the ACUT 522 for analysis and comparison with simulated circuit designs done in the cores 110. Therefore, various analog circuits can be simulated, prototyped, and tested with the same components. By having the ability to interleave with multiple cores, very high frequency operation is possible with the ability to process, analyze, and display such high frequency waveforms.

Figure 7A:
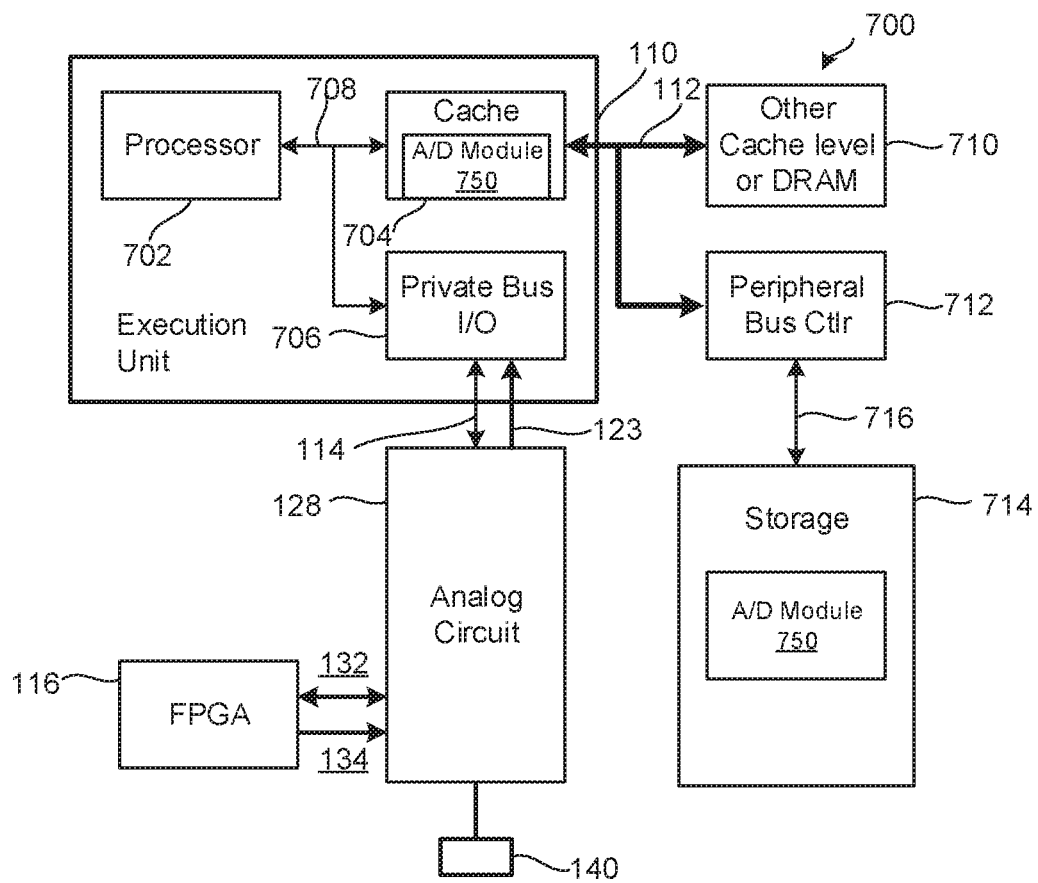
FIG. 7A is an example mixed signaling socket with one or more enterprise class CPU cores that include a module with instructions to do an A/D conversion.

FIG. 7A is an example mixed signaling socket 700 that includes one or more enterprise class CPU cores 110. Each of CPU cores includes a processor 702 coupled via an internal CPU bus 708 to a local set of caches 704 that allow the processor 702 to read instructions from computer readable medium and execute them. The internal CPU bus 708 is further coupled to a private bus I/O controller 706 which allows the processor 702 to interface directly to the analog circuit 128 via private bus 114 and EOC handshake control 123. Having the private bus 114 interface allows the processor 702 to bypass having to use an inter-core link 112 which would require arbitration and unknown delays. The inter-core link 112, however, is used to send and receive instructions and data from system memory, such as another cache or DRAM 710 and storage 714 via a peripheral bus controller 712 and peripheral bus 716, such as a PCI 3.0 bus, though others peripheral busses can be used by those of skill in the art. The analog circuit 128 is coupled also to an analog input 140. The analog circuit in conjunction with the data provided by the process to a D/A converter in the analog circuit 128 allows the processor to accurately perform an analog to digital conversion of the analog input 140. To ensure accurate sampling and coordination with the processor 702, a field programmable array 116 is programmed by a processor 702 to create a set of predictable clock signals 132 and analog to digital conversion timing 134 that is used by the analog circuit 128 and passed on to the processor 702 via the EOC handshake control 123. For instance, the instructions executed by the processor 702 may be included in the A/D module 750 to perform one or more types of A/D conversions of an analog input 140. In order to achieve high sampling rates, the A/D code also resides in the execution unit cache which allows it to execute code at the core frequency. The A/D module 750 may use one or more conversion techniques to perform an analog to digital (A/D) conversion to create a digital representation of the analog input using predictable clock timing 134 and control signals 132 from the FPGA 116 control circuit.

Accordingly, in one example MX socket with multiple cores, a set of enterprise class central processing unit (CPU) cores 110 are coupled via an inter-core link 112. A set of analog circuits 128 is each coupled to a respective CPU core 110 and each having an analog input 140 coupled to a comparator 124 (FIG. 1) via a sample and hold circuit 122 (FIG. 1). The comparator 124 is coupled to a digital to analog converter 126 (FIG. 1) that is further coupled via a separate private bus 114 to the respective CPU core 110. A field programmable gate array (FPGA) 116 programmed as a control circuit is coupled to the inter-core link 112 and the set of analog circuits 128 to provide predicable clock timing 134 to the set of analog circuits 128 and control signals 132 to the set of CPU cores 110. An analog to digital module 750 in at least one CPU core 110 includes instructions to perform an analog to digital (A/D) conversion to create a digital representation of the analog input using the predictable clock timing 134 and control signals 132 from the FPGA 116.

The set of CPU cores 110 may include a supervisory CPU core 310 (FIG. 3) that manages the configuration of the FPGA 116, programming of the CPU cores 110 for the A/D conversion, and aggregation of the digital representation of the analog input 140. In some examples, the set of CPU cores 110 may operate in an interleave mode and the FPGA 116 control circuit control signals (123, 440-1 to 440-N, FIG. 4) sequences through each of the respective analog circuits 128. The FPGA 116 control circuit may also create a temporal sequence of multiple clocks 134 wherein each of the multiple clocks 134 are coupled to a respective analog circuit 128. Further, each of the analog circuits 128 may be provided an end of conversion (EOC) handshake control 123 from the FPGA 116 control circuit and the EOC handshake control 123 is passed on to the respective CPU core 110. The respective CPU core 110 performs a handshake with the EOC handshake control 123 and the separate private bus 114 to do the A/D conversion.

Figure 7B:
FIG. 7B is a set of example additional modules of instructions that can be used to implement a lab-on-a-chip MX socket.

FIG. 7B is a set of example additional modules of instructions that can be used with the lab-on-a-chip MX socket 500 of FIG. 5 described above. For instance, a configuration module 752 in a supervisory CPU core 510-M may be used to configure the FPAA 520 to create an analog circuit under test having inputs coupled to outputs 550-1, 550-N of the set of extra D/A converters 526 and at least one output 540-1, 540-N coupled to the analog input of the MX analog section 120. A stimulation module 754 in the supervisory CPU core 510-M may be used to provide a set of analog signals on the outputs 550-1, 550-N of the extra D/A converters 526 to exercise the functionality of the ACUT 522. An analysis module 756 in the supervisory CPU core 510-M may be used to gather the digital representations of the analog input 540-1, 540-N and compare to expected simulated results that were earlier generated on the enterprise class CPU cores 110-1, 110-N using a simulation program. An interleave module 758 may be used to configure the FPGA 116 to provide interleave mode timing for the set of CPU cores 110-1, 110-N and to configure multiple CPU cores 110-1, 110-N to perform the A/D conversion using the interleave mode timing such as shown in FIG. 4.

Figure 8A:
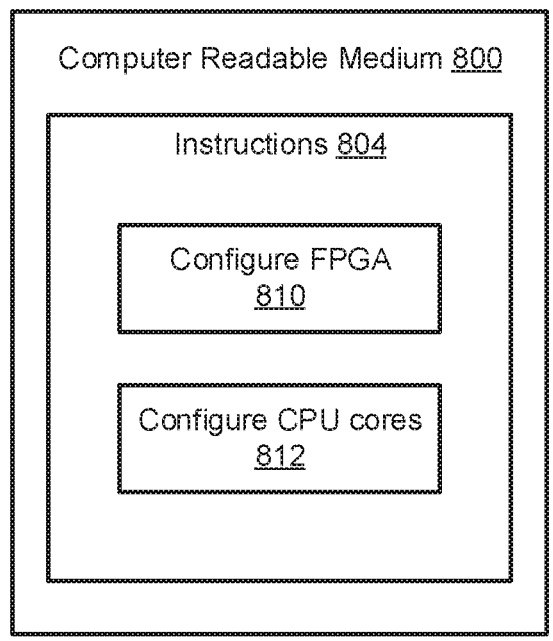
FIG. 8A is an example tangible and non-transitory computer readable medium.

FIG. 8A is an example tangible and non-transitory computer readable medium 800 that includes instruction 804 for execution on one or more processors in the set of multiple CPU cores. A computer readable medium 800 allows for storage of one or more sets of data structures and instructions 804 (e.g. software, firmware, logic) embodying or utilized by any one or more of the techniques, methodologies, or functions described herein. The instructions 804 may also reside, completely or at least partially, with the static memory of storage 714, the main memory such as DRAM 710, and/or within the processor, such as cache 704 during execution by the processor 702. Accordingly, the DRAM memory 710 and the processor cache memory 704 also constitute computer readable medium 800. The term "computer readable medium" 800 may include single medium or multiple media (centralized or distributed) that store the one or more instructions or data structures. The computer readable medium 800 may be implemented to include, but not limited to, solid state, optical, and magnetic media whether volatile or non-volatile. Such examples include, semiconductor memory devices (e.g. Erasable Programmable Read-Only Memory (EPROM), Electrically Erasable Programmable Read-only Memory (EEPROM), and flash memory devices), magnetic discs such as internal hard drives and removable disks, magneto-optical disks, and CD-ROM (Compact Disc Read-Only Memory), and DVD (Digital Versatile Disc) disks.

The instructions 804 may include one or more modules. One module may be a configure FPGA module 810 that has instructions to configure, by synchronizing clocks to the core frequency, an FPGA 116 to provide predictable clock timing 134 to a set of enterprise class CPU cores 110-1, 110-N and control signals 132 for coordinating an analog to digital (A/D) conversion. A configure CPU cores module 812 has instructions to configure at least one of the set of CPU cores 110-1, 110-N with an analog to digital module 750 with further instructions to perform the A/D conversion and thereby create a digital representation of a sampled analog input 140 using the predictable clock timing 134 and control signals 132 from the FPGA 116 by communicating over a private bus 114 to a digital to analog (D/A) converter 126-1 (FIG. 1) that compares the sampled analog input 140 to an output of the D/A converter 126-1 over multiple instruction clock cycles of the at least one CPU core 110-1, 110-N.

Figure 8B:
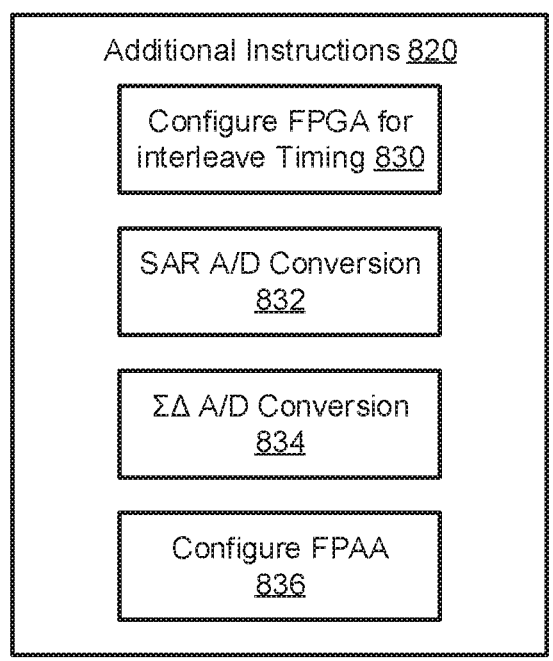
FIG. 8B is an example set of additional instructions that may be stored in the computer readable medium of FIG. 8A.

FIG. 8B is an example set of additional instructions 820 that may be stored in computer readable medium 800. A configure FPGA for interleave timing module 830 has instruction used to configure the FPGA 116 to provide interleave mode timing (see FIG. 4) for the set of CPU cores 110-1, 110-N. The instructions may also configure at least one of the set of CPU cores 110-1, 110-N to perform the A/D conversion using the interleave mode timing. An SAR A/D conversion module 832 has instructions to configure a field programmable analog array (FPAA) 520 with an analog circuit under test (ACUT) 522. A SAR A/D conversion module 832 has instructions to perform a successive approximation register A/D conversion such as described in one example in FIGS. 1 and 2. A ΣΔ A/D conversion module 834 has instructions to perform a sigma-delta A/D conversion such as described in one example in FIGS. 6A and 6B. A computer readable medium of claim 6, wherein the analog to digital module includes instructions The various examples described herein may include logic or a number of components, modules, or constituents. Modules may constitute either software modules, such as code embedded in tangible non-transitory machine readable medium) or hardware modules. A hardware module is a tangible unit capable of performing certain operations and may be configured or arranged in certain manners. In one example, one or more computer systems or one or more hardware modules of a computer system may be configured by software (e.g. an application, or portion of an application) as a hardware module that operates to perform certain operations as described herein.

In some examples, a hardware module may be implemented as electronically programmable. For instance, a hardware module may include dedicated circuitry or logic that is permanently configured (e.g. as a special-purpose processor, state machine, a field programmable gate array (FPGA), a field programmable analog array (FPAA) or an application specific integrated circuit (ASIC) to perform certain operations. A hardware module may also include programmable logic or circuitry (e.g. as encompassed within a general purpose processor or other programmable processor) that is temporarily configured by software to perform certain operations. It will be appreciated that the decision to implement a hardware module electronically in dedicated and permanently configured circuitry, or in temporarily configured circuitry (e.g. configured by software) may be driven by cost and time considerations.

While the claimed subject matter has been particularly shown and described with reference to the foregoing examples, those skilled in the art will understand that many variations may be made therein without departing from the intended scope of subject matter in the following claims. This description should be understood to include all novel and non-obvious combinations of elements described herein, and claims may be presented in this or a later application to any novel and non-obvious combination of these elements. The foregoing examples are illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. A mixed signaling socket, comprising:
   a set of enterprise class central processing unit (CPU) cores coupled via an inter-core link;
   a set of analog circuits having an analog input, each analog circuit coupled to a respective CPU core, and including a digital to analog converter coupled via a separate private bus to the respective CPU core;
   a field programmable gate array (FPGA) control circuit coupled to the inter-core link and the set of analog circuits to provide a predictable clock timing to the set of analog circuits and control signals to the set of CPU cores; and
   an analog to digital module in at least one CPU core that includes instructions to perform an analog to digital (A/D) conversion to create a digital representation of the analog input using the predictable clock timing and control signals from the FPGA.

2. The mixed signaling socket of claim 1 wherein the set of CPU cores includes a supervisory CPU core that manages configuration of the FPGA, programming of the CPU cores for the A/D conversion, and aggregation of the digital representation of the analog input.

3. The mixed signaling socket of claim 2, wherein the set of CPU cores operate in an interleave mode and the FPGA control circuit control signals sequences through each of the respective analog circuits.

4. The mixed signaling socket of claim 1 wherein the FPGA control circuit creates a temporal sequence of multiple clocks, each of the multiple clocks coupled to a respective analog circuit.

5. The mixed signaling socket of claim 1 wherein each of the analog circuits is provided an end of conversion (EOC) signal from the FPGA control circuit and the EOC signal is passed on to the respective CPU core, and wherein the respective CPU core performs a handshake with the EOC signal and the separate private bus to do the A/D conversion.

6. A non-transitory computer readable medium, comprising instructions that when read and executed by a processor cause the processor to:
 configure a field programmable gate array (FPGA) to provide a predictable clock timing to a set of enterprise class CPU cores and control signals for coordinating an analog to digital (A/D) conversion; and
 configure at least one of the set of CPU cores with an analog to digital module with instructions to perform the A/D conversion to create a digital representation of a sampled analog input using the predictable clock timing and control signals from the FPGA by communicating over a private bus to a digital to analog (D/A) converter that compares the sampled analog input to an output of the D/A converter over multiple instruction clock cycles of the at least one CPU core.

7. The computer readable medium of claim 6, wherein the instructions to configure the FPGA include instructions to configure the FPGA to provide interleave mode timing for the set of CPU cores and wherein the instructions to configure at least one of the set of CPU cores includes instructions to configure multiple CPU cores to perform the A/D conversion using the interleave mode timing.

8. The computer readable medium of claim 6 further comprising instructions to:
 configure a field programmable analog array (FPAA) with an analog circuit under test (ACUT);
 configure one of the set of CPU cores with instructions to perform a set of digital to analog conversions that stimulate the ACUT; and
 configure the FPAA to connect an output of the ACUT to the sampled analog input.

9. The computer readable medium of claim 6, wherein the analog to digital module includes instructions to perform a successive approximation register A/D conversion.

10. The computer readable medium of claim 6, wherein the analog to digital module includes instructions to perform a sigma-delta A/D conversion.

11. A mixed signaling lab-on-a-chip, comprising:
 a set of enterprise class central processing unit (CPU) cores coupled via an inter-core link;
 a set of analog circuits having an analog input, each analog circuit coupled to a respective CPU core, and including a digital to analog (D/A) converter coupled via a separate private bus to the respective CPU core;
 a set of extra D/A converters coupled to a supervisory CPU core via another separate private bus;
 a field programmable gate array (FPGA) control circuit coupled to the inter-core link and the set of analog circuits to provide a predictable clock timing to the set of analog circuits and control signals to the set of CPU cores;
 a field programmable analog array (FPAA) coupled to the inter-core link and having inputs coupled to the set of D/A converters and at least one output coupled to the analog input; and
 an analog to digital module in at least one CPU core that includes instructions to perform an analog to digital (A/D) conversion to create digital representation of the analog input using the predictable clock timing and control signals from the FPGA.

12. The mixed signaling lab-on-a-chip of claim 11, further comprising a configuration module in the supervisory CPU core to configure the FPAA to create an analog circuit under test having inputs coupled to outputs of the set of extra D/A converters and at least one output coupled to the analog input.

13. The mixed signaling lab-on-a-chip of claim 12, further comprising a stimulation module in the supervisory CPU core to provide a set of analog signals on the outputs of the extra D/A converters to exercise a functionality of an analog circuit under test (ACUT).

14. The mixed signaling lab-on-a-chip of claim 13, further comprising an analysis module in the supervisory CPU core to gather digital representations of the analog input and compare to expected simulated results.

15. The mixed signaling lab-on-a-chip of claim 11, further comprising an interleave module to configure the FPGA to provide interleave mode timing for the set of CPU cores and to configure multiple CPU cores to perform the A/D conversion using the interleave mode timing.

* * * * *